United States Patent [19]
Yost et al.

[11] Patent Number: 5,855,323
[45] Date of Patent: Jan. 5, 1999

[54] METHOD AND APPARATUS FOR JETTING, MANUFACTURING AND ATTACHING UNIFORM SOLDER BALLS

[75] Inventors: Frederick G. Yost, Cedar Crest; Darrel R. Frear; David T. Schmale, both of Albuquerque, all of N. Mex.

[73] Assignee: Sandia Corporation, Albuquerque, N. Mex.

[21] Appl. No.: 746,602

[22] Filed: Nov. 13, 1996

[51] Int. Cl.$^6$ .................................. B05B 1/24; B05B 1/08
[52] U.S. Cl. .............................. 239/135; 239/13; 239/82; 239/85; 239/102.2; 239/321; 239/329; 219/422; 219/243; 222/146.5; 222/333; 222/386; 222/465
[58] Field of Search .................. 239/82, 85, 13, 239/102.2, 128, 133, 134, 135, 320, 321, 329; 222/146.5, 333, 386, 465; 219/420, 421, 422, 424, 243, 221; 401/1, 2

[56] References Cited

U.S. PATENT DOCUMENTS

| | | | |
|---|---|---|---|
| 1,754,382 | 4/1930 | Baracate | 239/82 X |
| 4,167,245 | 9/1979 | Kock et al. | 239/329 X |
| 4,527,717 | 7/1985 | Emoto et al. | 222/146.5 X |
| 4,635,849 | 1/1987 | Igashira et al. | 239/102.2 |
| 4,791,439 | 12/1988 | Guiles | 222/146.5 X |
| 4,981,249 | 1/1991 | Kawshima et al. | 228/37 |
| 5,199,641 | 4/1993 | Hohm et al. | 239/102.2 |
| 5,229,016 | 7/1993 | Hayes et al. | 222/590 |
| 5,248,087 | 9/1993 | Dressler | 239/102.2 |
| 5,320,250 | 6/1994 | La et al. | 222/146.5 X |
| 5,356,658 | 10/1994 | Hertz et al. | 427/96 |
| 5,377,961 | 1/1995 | Smith et al. | 266/237 |
| 5,685,485 | 11/1997 | Mock et al. | 239/102.2 |

Primary Examiner—Kevin P. Shaver
Assistant Examiner—Robin O. Evans
Attorney, Agent, or Firm—Brian W. Dodson

[57] ABSTRACT

An apparatus and process for jetting molten solder in the form of balls directly onto all the metallized interconnects lands for a ball grid array package in one step with no solder paste required. Molten solder is jetted out of a grid of holes using a piston attached to a piezoelectric crystal. When voltage is applied to the crystal it expands forcing the piston to extrude a desired volume of solder through holes in the aperture plate. When the voltage is decreased the piston reverses motion creating an instability in the molten solder at the aperture plate surface and thereby forming spherical solder balls that fall onto a metallized substrate. The molten solder balls land on the substrate and form a metallurgical bond with the metallized lands. The size of the solder balls is determined by a combination of the size of the holes in the aperture plate, the duration of the piston pulse, and the displacement of the piston. The layout of the balls is dictated by the location of the hooks in the grid. Changes in ball size and layout can be easily accomplished by changing the grid plate. This invention also allows simple preparation of uniform balls for subsequent supply to BGA users.

17 Claims, 3 Drawing Sheets

METHOD AND APPARATUS FOR JETTING, MANUFACTURING AND ATTACHING UNIFORM SOLDER BALLS

GOVERNMENT RIGHTS

The Government has rights to this invention pursuant to Contract No. DE-AC04-76DP00789 awarded by the U.S. Department of Energy.

BACKGROUND OF THE INVENTION

1. Field of the Invention (Technical Field)

The invention relates to soldering apparatuses and processes, in particular manufacturing uniform solder balls and soldering interconnects to a ball grid array (BGA) package.

2. Background Art

Package designs for microelectronic devices have moved from through-hole to surface mount technology in order to increase the useable printed wiring board area available by utilizing both sides of the boards. The traditional geometry for surface mount devices is peripheral arrays, where the leads are on the edges of the device. As the technology drives towards high input/output (I/O) count (increasing number of leads) and smaller packages with finer pitch (less distance between peripheral leads), limitations on peripheral surface mount devices arise. It is the opinion of experts in this field that the limit of manufacturability of peripherally leaded devices lies at a pitch of approximately 0.3 mm. The leads on these fine pitch devices are fragile and can be easily bent. At a 0.3 mm pitch, it becomes difficult to deliver solder paste by stencil printing or plating processes to leads spaced this closely. If there is too much solder mass, bridging between leads can occur. If not enough solder is applied, mechanical and electrical continuity can be lost.

A solution to the fine pitch issue is to shift the leads from the periphery of the device to the area under the device. This scheme is called areal array packaging and is exemplified by the ball grid array (BGA) package. The following example demonstrates the advantage of areal array versus peripheral, with regard to pitch. A 640 lead package (with a 50.8 mm side length) comprises a pitch on a peripheral device of 0.31 mm, while that of a BGA package has a pitch of 1.95 mm.

The current practice to join BGA packages to printed wiring boards involves a hierarchy of solder alloy compositions. A high melting temperature ball (e.g., 90 Pb—10 Sn that melts at 300° C.) is typically used for a standoff. These balls are made by either a spray forming operation or by cutting wire to specific lengths then reflowing them in flux. Both techniques result in a range of solder ball size that requires a sieving operation to produce solder balls of uniform dimensions. The process to create the balls represents a significant fraction of the overall BGA package manufacturing cost and it is estimated that solder balls alone make up 13% of this cost. A lower melting temperature solder (e.g. 63 Sn—37 Pb near eutectic solder) paste is used to join the balls to the package substrate and board. One method to attach the high melting temperature balls to the substrate involves loading a graphite fixture, or boat, that is drilled with holes of the same diameter as the balls, in the desired areal array pattern. The package substrate is patterned with the lower melting temperature solder paste using either a dispensing method, screen printing, or stenciling the paste. The substrate and fixture are then placed together so that the balls make intimate contact with the solder paste. Another method to attach the balls is to use a chuck fitted with a machined template that has multiple apertures through which a vacuum attracts the solder balls. With some robotic vibration all holes are eventually filled and extra balls are shaken loose. The balls are then fluxed and placed in unison onto the substrate that has been deposited with solder paste. After the ball placement operation, the assembly goes through a reflow furnace that melts the solder paste and joins the paste to the balls and substrate. The fixture is then carefully removed so as to not damage the joined balls. The substrate is then cleaned to remove flux residue using a solvent and distilled water rinse. Final assembly involves aligning the substrate/ball composite to the board, providing lower melting temperature solder paste on the lands and reflowing and subsequent cleaning of the joints.

Another option to manufacture BGA solder joints is by use of monolithic ball metallurgy techniques where only lower melting temperature solder is utilized. Using this technique, a controlled volume of solder paste is dispensed, or screen printed onto the metallized pads on the boards. The BGA devices have the lower melting temperature solder balls reflowed onto the contacts and the two parts are aligned and reflowed. A variation of this scheme is to not use paste on the boards but just enough flux to break down surface oxides and then place solder balls on the fluxed substrate, (as discussed above using a fixture) then reflow the package to the board. The problems with this methodology are concerns over the formation of the solder balls from the paste or the introduction of voids into the joints from the volatiles in the flux.

U.S. Pat. No. 5,229,016 to Hayes, et al., entitled Method and Apparatus for Dispensing Spherical Shaped Quantities of Liquid Solder, U.S. Pat. No. 5,377,961 to Smith, et al., entitled Electrodynamic Pump for Dispensing Molten Solder and U.S. Pat. No. 4,981,249 to Kawashima, et al., entitled Automatic Jet Soldering Apparatus, are all nozzled devices for dispensing one droplet or single ball at a time. Therefore, to use these devices, either the nozzle must be moved to the desired location or the circuit board or other surface to be soldered must be moved to the location of the nozzle. These devices do not teach or disclose a multi-apertured device for simultaneously dispensing solder balls.

U.S. Pat. No. 5,356,658 to Hartz, et al., entitled Flexible High Speed Liquid Dispenser is a multi-apertured device. However, the multi-apertured plate is dipped into the liquid, thereby filling the apertures with the liquid and then placed over the surface to be dispensed, and air blown over the apertures causing the liquid in the apertures to extrude and cover the surface. This device will not work with solder because there is no means to keep the liquid at a certain temperature. Additionally, this is not a jetting device but teaches an extrusion process. In a jetting event a drop or stream of liquid is emitted from an aperture with sufficient kinetic energy to launch said liquid into flight. No mating surface need be in contact with the fluid during the jetting event. In most applications of jetting, a mating surface is used, but it can be placed a signficant distance from the jetting aperture. In an extrusion process the liquid emerges from the aperture with relatively low kinetic energy and is immediately contacted by the mating surface so that the liquid is never in free flight. An example of the extrusion process is silk screen printing. Finally, there are no controls to keep the dispensed liquid uniform in size in this prior art.

SUMMARY OF THE INVENTION (DISCLOSURE OF THE INVENTION)

In accordance with the present invention there is provided a multi apertured jetting apparatus for jetting consistent uniform balls. The preferred apparatus for depositing a plurality of uniform amounts of a liquid, comprises a heated reservoir comprising an apparatus for heating the liquid above a melting point, a multi-apertured plate affixed to the reservoir, structure for substantially simultaneously jetting the liquid through each aperture in the multi-apertured plate onto a surface. The preferred liquid comprises solder. The preferred reservoir comprises a chamber shaped so that when the structure for jetting is activated, the liquid has a flow stream substantially parallel to an axis of the apertures. The preferred multi-apertured plate comprises a material not wetted by the fluid. The preferred multi-apertured plate comprises apertures conforming to a predetermined geometric array. The preferred struction for jetting comprises a piston driven apparatus. The preferred piston driven apparatus comprises at least one piezoelectric crystal. The piston driven apparatus can further comprise a controller for controlling piston speed and piston travel. The piston driven apparatus can also comprise a shaped piston face. The structure for jetting can comprise a member from the group consisting of a cam driven apparatus, a fluid drive apparatus, a gas driven apparatus and an electromagnetic field. The preferred apparatus further comprises an apparatus for controlling an atmosphere of the liquid.

The preferred method for depositing uniform amounts of liquid comprises the steps of heating the liquid above the liquid's melting temperature in a reservoir, affixing a multi-apertured plate to the reservoir, and jetting the liquid through the apertures in the multi-apertured plate. The preferred liquid comprises solder. The preferred step of jetting comprises the liquid having a flow stream substantially parallel to an axis of the apertures. The preferred step of affixing the multi-apertured plate comprises affixing the multi-apertured plate with apertures conforming to a particular geometric array. The preferred step of jetting comprises driving a piston. The preferred step of driving a piston comprises activating at least one piezoelectric crystal. The preferred step of driving a piston comprises controlling piston speed and piston travel. The preferred step of driving a piston comprises driving a shaped piston face. The alternative step of jetting comprises providing a member from the group consisting of a cam driven apparatus, a fluid driven apparatus, a gas driven apparatus and an electromagnetic field. The preferred method further comprises the step of controlling an atmosphere of the liquid.

A primary object of the present invention is the provision of a low cost process of making and affixing solder balls to BGA packages.

Another object of the present invention is the provision of uniform solder balls without the need to cull nonconforming ones.

A primary advantage of the present invention is the elimination of reflow operations and of time consuming placement of solder balls onto the substrate.

Another advantage of the present invention is the elimination of errors due to manual handling and placement of solder balls on the substrate.

Yet another advantage of the invention is the ability to jet molten solder directly onto the interconnect lands.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS (BEST MODES FOR CARRYING OUT THE INVENTION)

The present invention comprises an apparatus and process for jetting molten solder in the form of balls directly onto all the metallized interconnect lands for a BGA package with no solder paste required. Although the following disclosure describes solder technology, it should be noted that the apparatus and method may be employed to jet multiple droplets of other fluids, for other applications. This invention allows simple preparation of uniform balls for subsequent supply to BGA users. The advantage of this technology is that it eliminates the steps of acquiring balls and then placing the individual balls onto the substrate then reflowing by dispensing uniform molten balls that can directly bond with the substrate. The reflow operation and errors due to mishandling of the individual balls are eliminated thereby saving equipment costs, time, and processing costs.

Figure 1:
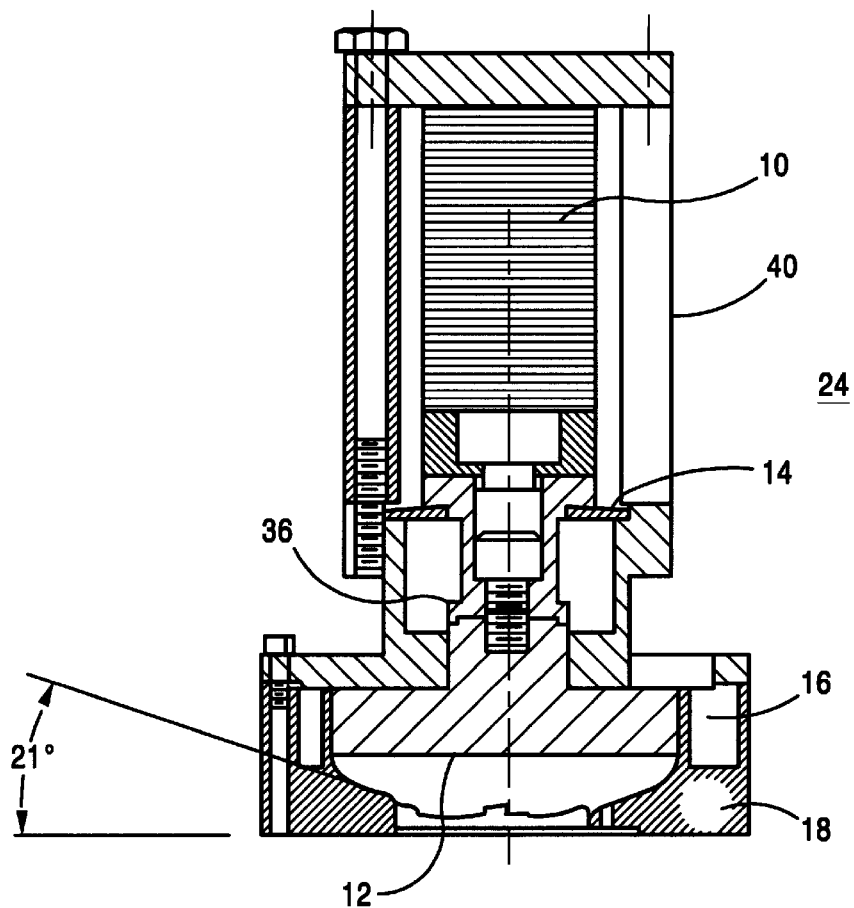
FIG. 1 is a cross section schematic of FIG. 2 illustrating the the preferred jetting apparatus.
Figure 2:
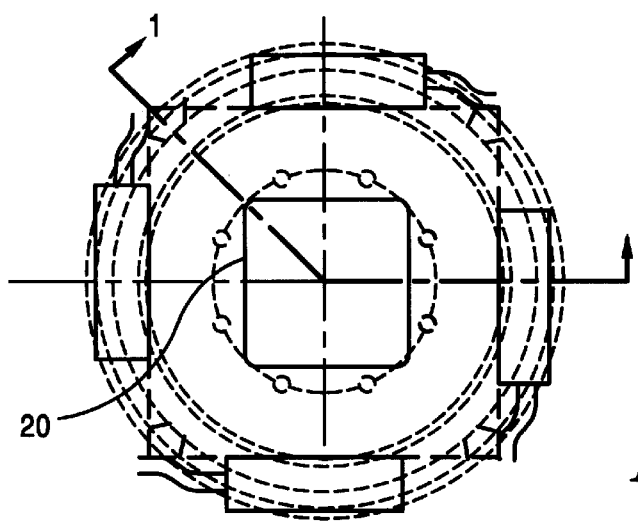
FIG. 2 is a bottom view of the jetting apparatus.

The preferred apparatus for jetting the arrays of solder balls is shown in the cut out view in FIG. 1 along 1—1 of FIG. 2. Digitally controlled piezoelectric actuator 10 is in contact with piston 12. Energizing piezoelectric actuator 10, causes it to expand and move the piston 12. Bevel spring 14 is oriented, as shown, to preload piezoelectric actuator 10. Reservoir 16 is for containing the solder. Reservoir 16 is preferably made of anodized aluminum and contains cartridge heaters 18 to keep the solder molten. Aperture plate 20, of FIG. 2, is preferably made of graphite (or other materials that cannot be wet by the solder), and serves as the jetting aperture and defines the layout of the array. Although the aperture plate 20 as shown is flat for the preferred embodiment, the aperture plate can be configured into a curved surface such as a spherical shape (not shown). The droplets would then be jetted from the apertures perpendicular to the surface and emerged as non-parallel rays. Also, each aperture could be prepared such that its axis has a unique direction, not necessarily parallel to the other apertures or perpendicular to the aperture plate surface (not shown). Chamber 22 surrounds the jetting apparatus 24 and provides an inerted environment of nitrogen gas.

Figure 3A:
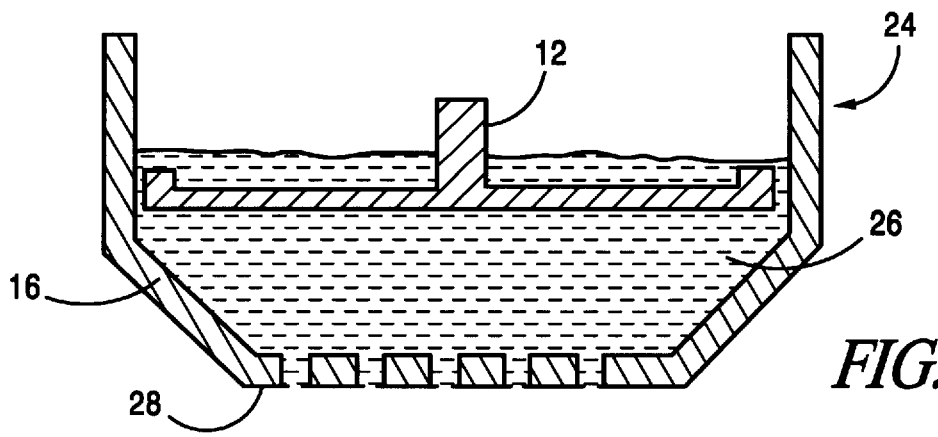
FIG. 3A illustrates the preferred jetting operation prior to activation.
Figure 3B:
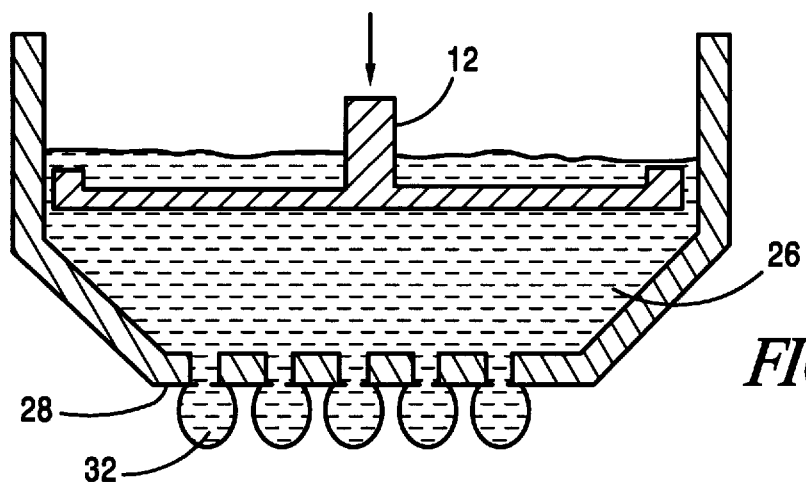
FIG. 3B illustrates the jetting operation during activation of the piston.
Figure 3C:
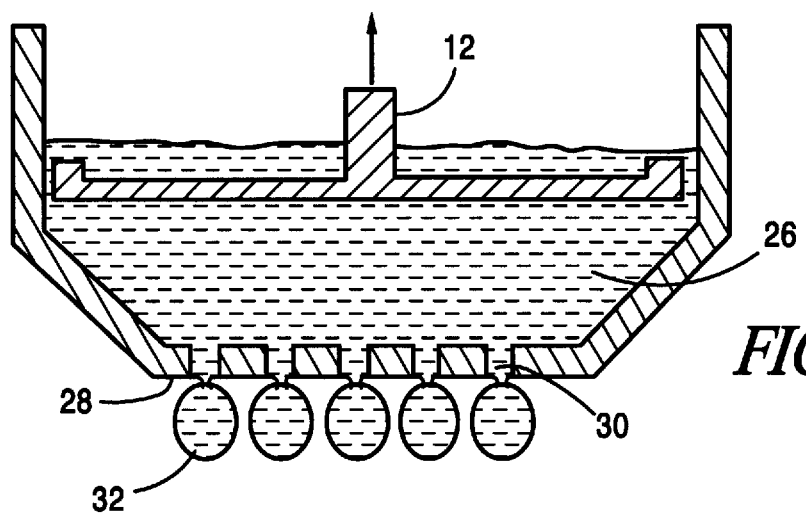
FIG. 3C illustrates the retraction of the piston and the formation of the solder balls.

FIG. 2 is a bottom view of the preferred embodiment, and with FIGS. 3A, 3B and 3C illustrate the operation of jetting apparatus 24. FIG. 3A shows the preferred jetter 24 prior to initiation. Molten solder 26 is placed in reservoir 16. Piston 12 pushes down on the bath of molten solder 26 forcing a volume of solder 32 to be extruded out through grid 28 as shown in FIG. 3B. The voltage to piezoelectric actuator 10 is removed and bevel spring 14, of FIG. 1, forces piston 12 back, as shown in FIG. 3C. The withdrawal of piston 12 causes an instability to form in each molten solder drop 32 near each aperture 30. Each aperture 30 on a given aperture plate 20 may be of the same size or of varying size in order to jet drops of different dimensions. Varying size drops can be useful in situations of high thermomechanical fatigue of the perimeter contacts of a BGA package. Larger drops could be jetted to these locations to provide added resistance to fatigue. The instability is the point where the drops 32 break off and fall to the substrate (not shown). The conditions for the rate of piston motion, distance, aperture size, etc., are optimized in order to form the proper size of the solder balls (or droplets).

Piezoelectric actuator 10 is preferably a number of flat piezoelectric crystals that are joined in series along their expansion axes. Therefore, when voltage is applied, all the crystal segments expand uniformly and reproducibly. As shown in FIGS. 1 and 2, the bottom of piezoelectric actuator 10 bears directly on shaft of piston 44. There is little compliance in the crystals of piezoelectric actuator 10, spring clamp 36, and piston 12 so the displacement generated by the crystals in piezoelectric actuator 10 is directly translated into displacement of piston 12. Piezoelectric actuator 10 allows precise control of the piston displacement during pulses with travel of 0 to 0.002" and rates from 0.0003 to 0.0017 in/msec. A hold time can be inserted into the pulse at the peak of 0 to 9 msec. Piston 12 must only travel about 0.001" to displace the volume necessary to form 400 spheres of 0.029" diameter.

Bevel spring 14 is compressed by spring clamp 36 as shown in FIG. 1. The purpose of bevel spring 14 is to maintain a preload on piezoelectric actuator 10 and drive piston 12 up after the voltage of the piezoelectric actuator 10 is reduced. The compressive preload of bevel spring 14 is preferably 300 to 400 lbs. and is easily overcome by the force of the crystals in piezoelectric actuator 10.

Reservoir 16 contains and heats the solder. Reservoir 16 is preferably made from aluminum, or a like material, that has been anodized so that it will not be wet by the solder or be dissolved into the solder. Contained in base of reservoir 38 are cartridge heaters 18 that, by heating the aluminum housing, cause the solder to melt. The control of heaters 18 is preferably adjustable via a proportional integral derivative (p.i.d.) feedback controller (not shown) by applying 120 volts of alternating current through a solid state relay to the four 100 watt heaters 18 mounted in reservoir housing 40. Because housing 40 is aluminum and piston 12 and the crystals in piezoelectric actuator 10 are all in intimate contact, heating of piezoelectric actuator 10 must be minimized. The crystals in piezoelectric actuator 10 may not function properly above 180° C. and solder 26 is kept at 205° C. in reservoir 16. To reduce this heating problem, actuator 10 is preferably exposed to a continuous source of forced air to dissipate heat conducted from the housing 40, (not shown).

The solders used in electronic packaging are typically Sn—Pb based materials that rapidly oxidize in air when in a molten state. Therefore, it is important to control the atmosphere around the molten solder bath and where the solder is jetted. The atmosphere is controlled by placing the entire jetting assembly 24 inside a container, such as a Plexiglas® enclosure, that is equipped with a flow-through source of dry nitrogen gas (not shown). Other means of providing protective atmospheres such as a gas plasma can also be utilized. While in operation, nitrogen continuously flows through the container, preferably lowering the oxygen levels to below 100 parts per million, which is optimal for this application. Piezoelectric actuator 10 preferably extends above, but is sealed from, the enclosed container so that it can be easily cooled.

Aperture plate 20 that is used to jet the solder balls is attached to the bottom of the chamber 22 centered below the piston 12. Grid 28, of FIGS. 3A, 3B and 3C is on aperture plate 20, and is made of pyrolytic graphite, or the like. Pyrolytic graphite is preferably used because it can be accurately machined to the tolerances required for the hole spacing and distribution, will not dissolve into the molten solder, and is has sufficient strength to withstand the pulses imposed on the solder during the jetting operations. As shown in FIGS. 1 and 2, the aperture plate 20 and is attached to the solder reservoir 16 with bolts (not shown) and can be easily changed with an aperture plate with a different layout. An aluminum gasket can be placed in between, if desired (not shown). The interchangability allows for the possibility to jet balls of different size by changing the hole size in aperture plate 20 and the ball grid layout can be modified by changing the location of holes in aperture plate 20. This allows for a great deal of flexibility in the application of the jetting apparatus to a number of BGA geometries.

Figure 4A:
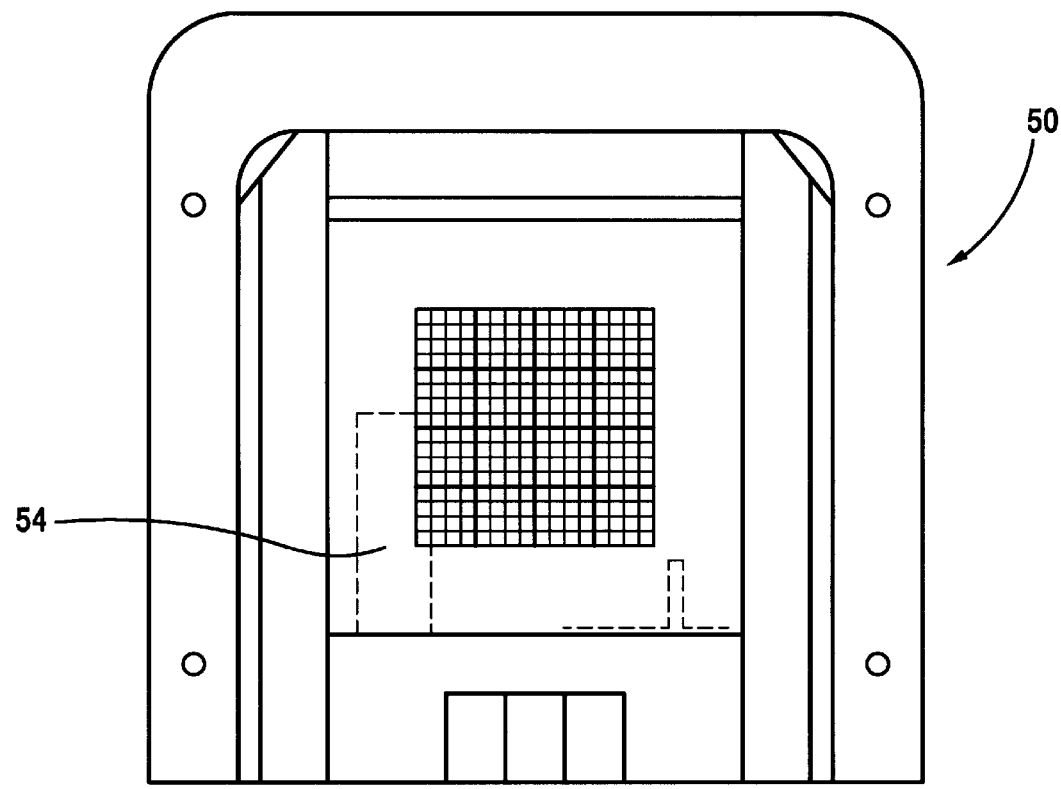
FIG. 4A is a top view of the board/aluminum heater fixture.
Figure 4B:
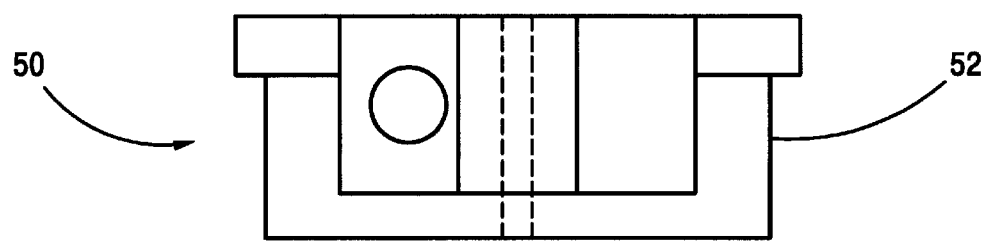
FIG. 4B is a front view of 4A.

Heater fixture 50 in FIGS. 4A & 4B consists of substrate cartridge heaters 54 that, when controlled voltage is applied, resistively heats fixture holder 52 for the substrate receiving the jetted balls. Heater fixture 50 heats holder 52 to just above the melting temperature of the solder so that when the molten jetted solder balls strike the surface they stay molten long enough to form an equilibrium spherical shape on the substrate. The substrates are aligned in heater fixture 50 with respect to the jetter grid and glide in and out on alignment grooves. The substrate typically consists of an insulating and non-wetting material (e.g., fiberglass epoxy) upon which metallized contacts (e.g., Cu) are placed. The jetted balls land on the appropriate metallized lands and, while the solder ball is molten, forms a metallurgical bond between substrate and solder.

The jetter 24 can also be used to create a source of solder balls without direct attachment to a board or substrate. Replacing heated fixture 50, as shown in FIGS. 4A and 4B with a free drop area where the solder can solidify in an inerted gas (nitrogen and helium) provides a source of solder balls (not shown). The balls would be extremely uniform in size and shape, as defined by the jetting parameters and aperture dimension.

Industrial Applicability:

The invention is further illustrated by the following non-limiting example.

EXAMPLE

To demonstrate the deposition of solder on copper pads a test board was designed to fit under the jetter. The boards were made from 0.062" thick FR-4 with a matching 20×20 array of 0.028" diameter ½" oz. copper pads. The board was designed to be positioned 0.125" below the aperture plate. The board was preheated so that the solder balls wet the copper pads and formed a metallurgical bond. The preheating was performed on an aluminum fixture to which a board was attached. A cartridge heater was used to heat the fixture and was controlled to within 1° C.. A schematic of the board and fixture is shown in FIGS. 4A and 4B. The location of the gridded balls was determined by robotic motion of an x-y-z table under the dispensing device.

A number of factors contributed towards determining the size and shape of the jetted balls. The magnitude and duration of the pulse on the piston defines the size of the balls (as a function of hole diameter, temperature, viscosity, surface energy of the molten solder, the force applied by the piston and time duration of that force) and location (number and spacing of the holes).

Theoretical calculations using finite element method simulations were performed to determine the optimum operating parameters for the jetter. The nodal equations used, as a basis, were the differential equations of fluid motion. The finite element equations were solved for a minimization of free surface energy of droplets using the volume of fluid method. Based on these simulations, the optimum pulse duration, piston throw distance, hold time, and aperture hole dimensions were determined.

Initial tests with the prototype jetter resulted in poor solder ball formation. The balls formed with tails. The presence of tails reduces the effectiveness of the jetter technology because it creates a non-uniform, non-planar, surface. The problem of tail formation was attributed to a concentration of oxygen in the chamber that resulted in oxide skin on the solder thereby inhibiting ball formation. After these experiments were performed, the environmental Plexiglas® chamber was built with the inerted nitrogen atmosphere. The formation of tails on the solder balls was no longer observed.

The second problem that was identified was an uneven distribution of solder balls across the grid after jetting. Depending upon the rate of piston motion, the balls in the middle of the grid would be larger or smaller than those on the outside of the grid. Fluid mechanics and finite element method simulations were used to analyze the interior of the solder reservoir for non-uniform flow. It was found that the initial chamber had sharp corners that caused discontinuities in solder flow in the chamber. The interior of the chamber was redesigned to smooth out the flow path as shown in the schematic drawing in FIG. 1. The new chamber eliminated the problem of non-uniform solder ball distribution.

The cost benefits of using the jetter technology were also examined using cost-of-ownership principles. The proposed jetter technology was compared with currently used ball placement technology and costs determined. The cost analysis software, Two-Cool™, calculated a cost savings of between 3× and 5× using the proposed jetter technology.

The preceding examples can be repeated with similar success by substituting the generically or specifically described reactants and/or operating conditions of this invention for those used in the preceding examples.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above, are hereby incorporated by reference.

What is claimed is:

1. An apparatus for simultaneously generating a plurality of solder balls, comprising:
   a) a reservoir comprising a means for heating to an operating temperature sufficient to melt solder and containing a working volume of melted solder;
   b) at least one aperture plate in fluid communication with the melted solder in said reservoir, comprising a plurality of apertures; and,
   c) means for generating a positive pressure pulse followed by a negative pressure pulse in the molten solder, wherein the positive pressure pulse causes separate volumes of molten solder to extrude through each of the apertures in the at least one aperture plate, and the negative pressure pulse causes a solder ball to detach from each of the separate volumes of molten solder.

2. The invention of claim 1 wherein said reservoir comprises a chamber shaped so that when said means for generating a positive pressure pulse followed by a negative pressure pulse is activated the molten solder has a flow stream substantially parallel to an axis of said plurality of apertures.

3. The invention of claim 1 wherein said aperture plate comprises a material not wetted by melted solder.

4. The invention of claim 1 wherein said means for generating a positive pressure pulse followed by a negative pressure pulse comprises a piston-driven apparatus.

5. The invention of claim 4 wherein said piston-driven apparatus comprises at least one piezoelectric crystal.

6. The invention of claim 4 wherein said piston driven apparatus further comprises a controller for controlling piston speed and piston travel.

7. The invention of claim 4 wherein said piston driven apparatus comprises a shaped piston face.

8. The invention of claim 1 wherein said means for generating a positive pressure pulse followed by a negative pressure pulse comprises a member from the group consisting of a cam driven apparatus, a fluid drive apparatus, a gas driven apparatus, and an electromagnetic field.

9. The invention of claim 1 further comprising a means for controlling the atmosphere surrounding the melted solder.

10. A method for simultaneously generating a plurality of solder balls, the method comprising the steps of:
    a) melting solder in a heated reservoir comprising at least one aperture plate, said at least one aperture plate comprising a plurality of apertures patterned consistent with the predetermined locations on a surface;
    b) extruding a volume of solder through each aperture by applying a positive pressure pulse to the melted solder; and
    c) detaching a plurality of solder balls by applying a negative pressure pulse to the melted solder.

11. The method of claim 10 wherein the steps of extruding a volume of solder and of detaching a plurality of solder balls comprise the melted solder in the heated reservoir having a flow stream substantially parallel to an axis of the apertures.

12. The method of claim 10 wherein the steps of extruding a volume of solder and of detaching a plurality of solder balls comprise driving a piston.

13. The method of claim 12 wherein the step of driving a piston comprises activating at lest one piezoelectric crystal.

14. The method of claim 12 wherein the step of driving a piston comprises controlling piston speed and piston travel.

15. The method of claim 12 wherein the step of driving a piston comprises driving a shaped piston face.

16. The method of claim 10 wherein the step of extruding a volume of solder comprises providing a member from the group consisting of a cam driven apparatus, a fluid driven apparatus, a gas driven-apparatus, and an electromagnetic field.

17. The method of claim 10 further comprising the step of controlling the atmosphere surrounding the melted solder.

* * * * *